(12) United States Patent
Mandrekar

(10) Patent No.: US 6,423,201 B1
(45) Date of Patent: Jul. 23, 2002

(54) METHOD OF IMPROVING THE ADHESION OF COPPER

(75) Inventor: Tushar Mandrekar, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/644,968

(22) Filed: Aug. 23, 2000

(51) Int. Cl.$^7$ ............................................... C23C 28/02
(52) U.S. Cl. .................. 205/186; 205/291; 427/250; 427/252; 427/255.18; 427/255.7; 427/578; 427/255.395
(58) Field of Search ................. 205/186, 291; 427/250, 252, 255.18, 255.7, 578, 255.395

(56) References Cited

U.S. PATENT DOCUMENTS

| | | | |
|---|---|---|---|
| 5,342,652 A | 8/1994 | Foster et al. ................. | 427/253 |
| 5,723,382 A | 3/1998 | Sandhu et al. ............... | 438/653 |
| 5,913,144 A | 6/1999 | Nguyen et al. .............. | 438/643 |
| 5,939,788 A | 8/1999 | McTeer ....................... | 257/751 |
| 5,943,600 A | 8/1999 | Ngan et al. .................. | 438/653 |
| 6,235,625 B1 * | 5/2001 | Lou | |

* cited by examiner

Primary Examiner—Timothy Meeks
(74) Attorney, Agent, or Firm—Moser, Patterson & Sheridan LLP

(57) ABSTRACT

The present invention provides a method of improving the adhesion of a copper layer to a barrier layer on a substrate. After deposition of a barrier layer, such as TiN, an amorphous silicon layer is deposited by striking a plasma over the substrate using a silicon source gas, such as silane, and an inert gas, such as argon (Ar). A Cu layer is deposited on the amorphous silicon. In another aspect of the invention, a TiSiN layer is deposited using a silicon source gas, such as silane, and a titanium source gas, such as TDMAT, during the deposition of the TiN barrier layer.

16 Claims, 3 Drawing Sheets

METHOD OF IMPROVING THE ADHESION OF COPPER

BACKGROUND OF THE INVENTION

1. Field of the Invention

The present invention relates generally to the fabrication of integrated circuits, and more particularly, to a system and method of adhering copper to a diffusion barrier surface.

2. Background of the Related Art

The demand for progressively smaller, less expensive, and more powerful electronic products, in turn, fuels the need for smaller geometry integrated circuits (ICs), and large substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different resistivity characteristics.

To meet the need for interconnects and vias having both low resistivity, and the ability to withstand volatile process environments, aluminum and tungsten have been used in the production of integrated circuits. These metals are popular because they are easy to use in a production environment. However, as geometries have become smaller, copper has replaced aluminum in the effort to reduce the size of lines and vias in an electrical circuit. The conductivity of copper is approximately twice that of aluminum and over three times that of tungsten. As a result, the same current can be carried through a copper line having half the width of an aluminum line. The electromigration characteristics of copper are also much superior to those of aluminum. Copper is approximately ten times better than aluminum with respect to electromigration. As a result, a copper line, even one having a much smaller cross-section than an aluminum line, is better able to maintain electrical integrity.

Copper cannot be deposited onto substrates using the conventional processes for the deposition of other metals like aluminum when the geometries of the selected IC features are small. It is impractical to sputter metal, either aluminum or copper, to fill small diameter vias, since the gap filling capability is poor. To deposit copper in the lines and interconnects of an IC interlevel dielectric, a chemical vapor deposition (CVD) technique has been developed. In the CVD process, copper is combined with a ligand, or organic compound, to make the copper volatile. Copper then becomes an element in a compound that is vaporized into a gas. Several copper gas compounds are available and one includes, for example the liquid complex copper$^{+1}$ hfac, TMVS (hfac being an abbreviation for the hexafluoro acetylacetonate anion and TMVS being an abbreviation for trimethylvinylsilane) with argon as the carrier gas. Selected surfaces of an integrated circuit, such as diffusion barrier material, are exposed to the copper gas in an elevated temperature environment. When the copper gas compound decomposes, copper is left behind on the selected surface.

FIG. 1 is a side cross-sectional view, of a typical CVD processing chamber 10, such as the TxZ Chamber made by Applied Materials, Inc. of Santa Clara, Calif. Chamber 10 includes a chamber body 20 that defines a cavity. A pedestal 30 is disposed in the cavity of the chamber body 20 and supports a substrate 40 on its upper surface 45 for processing. A gas supply unit (not shown) provides precursor gases to the chamber 10 which react with the substrate 40. A vacuum pump 50 communicates with a pumping channel 60 formed in the chamber 10 to evacuate the gases from the chamber 10. The vacuum pump 50 and the pumping channel 60 are selectively isolated by a valve disposed between the pumping channel 60 and the vacuum pump 50.

There are problems associated with the use of copper in IC processing. One problem with the use of copper is that copper diffuses into silicon dioxide, silicon and other dielectric materials. Therefore, barrier layers become increasingly important to prevent copper from diffusing into the dielectric and compromising the integrity of the device. Barrier layers for copper applications are available for inter-dielectric applications. The use of a thin silicon nitride (SiN) layer on the interlayer dielectric will effectively inhibit interlayer diffusion. Within the same dielectric layer it is difficult to provide an effective barrier to prevent leakage between lines. Several technologies are presently under investigation which add a barrier liner to the via sidewall separating the copper metal from the interlayer dielectric. Common physical vapor deposition (PVD) technologies are limited in high aspect and re-entrant structures due to the directional nature of their deposition. The barrier thickness will depend directly upon the structure architecture with the barrier becoming thinner on the sidewall near the structure bottom. Under overhangs on re-entrant structures the barrier thickness, and therefore the barrier integrity, will be compromised.

In contrast, CVD deposited films are by their nature conformal in re-entrant structures. Further, CVD deposited films maintain a high degree of conformity to the structure's lower interface. Silicon nitride ($Si_xN_y$) and titanium nitride (TiN) prepared by decomposition of an organic material are common semiconductor manufacturing materials which display the described conformal performance. Both materials are perceived as being good barriers to Cu interdiffusion, but are considered unattractive due to their high resistivity. The high resistive nature of the material would detrimentally effect the via resistance performance which must be maintained as low as possible. The conduction characteristics of the semiconductor regions are also important considerations in the design of a transistors and the fabrication process is carefully controlled to produce semiconductor regions in accordance with the design. Elements of copper migrating into these semiconductor regions can dramatically alter the conduction characteristics of associated transistors.

Various means have been suggested to deal with the problem of copper diffusion into integrated circuit material. Several materials, especially metallic ones like titanium nitride (TiN) have been used as barriers to prevent the copper diffusion process. A barrier layer of TiN can be deposited by either CVD or PVD, but CVD enjoys the advantage of more easily forming conformal layers in a hole that is relatively deep and narrow.

One CVD process for conformally coating TiN in a narrow hole is the TDMAT process. Referring again to FIG. 1, in the TDMAT process, a precursor gas of tetrakis-dimethylamido-titanium, $Ti(N(CH_4)_2)_4$, is injected into the chamber 10 through the showerhead 150 at a pressure from about 1 to about 9 Torr while the pedestal 30 holds the substrate 40 at an elevated temperature in a range of about 360° C. to about 450° C. Thereby, a conductive and conformal TiN layer is deposited on the substrate 40 in a CVD process. Because a TiN layer initially formed by the TDMAT process includes an excessive amount of carbon in the form of included polymers which can degrade its conductivity, the TDMAT deposition is usually followed by a second step wherein the deposited TiN layer is treated with a plasma. In the plasma step, the TDMAT gas in the chamber is replaced by a gas mixture of $H_2$ and $N_2$ in about a 50:50 ratio at a pressure of 0.5 to 10 Torr, and the power supply 170 is switched on to create electric fields between the showerhead 150 and the pedestal 30 sufficient to discharge the $H_2$:$N_2$ gas to form a plasma. The hydrogen and nitrogen species in the plasma reduce the carbonaceous polymer to volatile byproducts which are exhausted from the system and the quality of the TiN film is improved.

Titanium nitride is used primarily to function as a barrier layer. Its value as an adhesion or glue layer for a subsequently deposited CVD Cu layer has been hampered, due mainly to the presence of $O_2$ and other impurities in the surface of the TiN barrier layer at the time of deposition of CVD copper. Reactive CVD copper requires bonding sites for nucleation at the surface of the TiN layer. Impurities, like $O_2$ on the surface of the TiN layer do not allow proper bonding and the copper will not adhere and grow upon the TiN surface. Oxides are present on the surface of a TiN barrier layer even when the TiN layer and Cu layer are both deposited in the same vacuum chamber, as they are in the TxZ Chamber shown in FIG. 1. Various attempts have been made to overcome the problem of impurities in TiN layers that cause poor nucleation of reactive CVD copper. For example, a seed or flash coat of copper over the TiN surface literally covers up the problem and creates a thin surface of identical material for the subsequent deposition of copper. However, a flash coat of any material is typically performed in a separate, PVD chamber requiring a cost and time consuming transfer of the substrate to and from the CVD chamber where the TiN layer and copper layers are deposited.

Accordingly, there is a need in the manufacture of semiconductor devices, for a more effective method of nucleating copper, particularly on TiN barrier films on substrates. There is a further need to employ a method of improving the adhesion of CVD copper to a diffusion barrier material surface without the need of transferring the substrate to another chamber between CVD deposition of the TiN and Cu layers. There is yet a further need for a method of preparing a diffusion barrier surface, in advance of CVD copper deposition, to improve the adhesion of copper to the diffusion barrier surface. There is yet a further need for a process to promote the nucleation of copper onto TiN layers on semiconductor wafers using a precursor gas to avoid or to overcome the presence of $O_2$ on the surface of the TiN layer at the time of the CVD copper deposition.

SUMMARY OF THE INVENTION

The present invention generally provides a method of improving the adhesion of a CVD copper layer to a barrier layer on a substrate. In one aspect of the invention, an amorphous layer of silicon (Si) is deposited in a plasma enhanced CVD chamber after the deposition of the TiN barrier layer and prior to the Cu deposition and nucleation steps to provide good adherence of the Cu to the substrate. After deposition of the TiN layer, a plasma is struck in the CVD chamber over the substrate using a silicon source gas, such as silane, and an inert gas, such as argon (Ar). A thin amorphous Si layer is thereby formed over the TiN layer on the substrate. Upon deposition of the Cu layer, the Cu diffuses into the amorphous Si layer to improve nucleation of the Cu. Good adhesion to the substrate is achieved in this manner at the Si/Cu interface.

In another aspect of the invention, a TiSiN layer is deposited by introducing silane gas and a titanium source gas, such as TDMAT, during deposition of the TiN barrier layer. A Cu layer is then deposited on the TiSiN layer. This Cu layer can be, for example, a CVD Cu bulk deposition layer, a CVD Cu seed layer for electroplating, or a Cu electroplating layer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
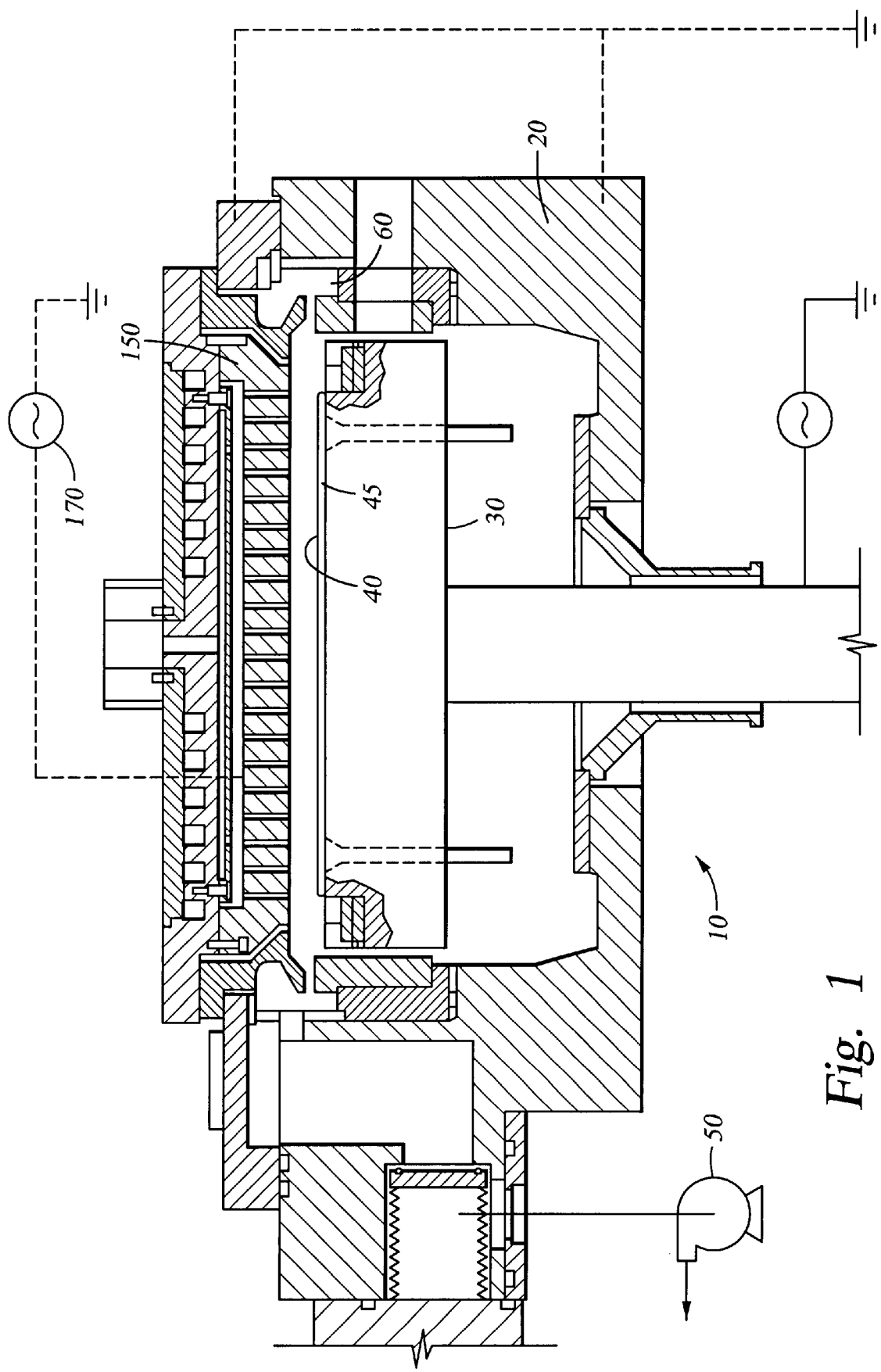
FIG. 1 is schematic view of a CVD chamber for use with the methods of the present invention.

The present invention provides a method for filling high aspect ratio interconnects on semiconductor substrates with metal, particularly sub-micron interconnects including contacts, vias, lines, or other features. In the techniques according to embodiments of the invention, a single CVD chamber such as the TxZ Chamber described above can be used to deposit the various layers of material including the TiN layer, the Si layer and the Cu layer as will be described. To facilitate control of the chamber described herein, a central processing unit (CPU) may be one of any form of general purpose computer processor that can be used in an industrial setting for controlling various chambers and sub processors. A memory or computer-readable medium is coupled to the CPU. The memory may be one or more of readily available memory such as random access memory (RAM), read only memory (ROM), floppy disk drive, hard disk, or any other form of digital storage, local or remote. Support circuits are coupled to the CPU for supporting the processor in a conventional manner. These circuits include cache, power supplies, clock circuits, input/output circuitry and subsystems, and the like. Deposition processes like those described and claimed herein are generally stored in the memory, typically as a software routine. The software routine may also be stored and/or executed by a second CPU that is remotely located from the hardware being controlled by the CPU.

The Cu layer may be deposited using by any known CVD Cu process or precursor gas, including copper$^{+2}$(hfac)$_2$ and Cu$^{+2}$(fod)$_2$ (fod being an abbreviation for heptafluoro dimethyl octanediene), but a preferred process uses the volatile liquid complex copper$^{+1}$hfac,TMVS (hfac being an abbreviation for the hexafluoro acetylacetonate anion and TMVS being an abbreviation for trimethylvinylsilane) with argon as the carrier gas. Because this complex is a liquid under ambient conditions, it can be utilized in standard CVD bubbler precursor delivery systems currently used in semiconductor fabrication. Both TMVS and copper$^{+2}$(hfac)$_2$ are volatile byproducts of the deposition reaction that are exhausted from the chamber. The deposition reaction is believed to proceed according to the following mechanism, in which (s) denoted interaction with a surface and (g) denotes the gas phase.

2Cu$^{+1}$hfac,TMVS(g) - - - →2Cu$^{+1}$hfac,TMVS(s)   step (1)

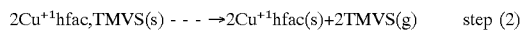

2Cu$^{+1}$hfac,TMVS(s) - - - →2Cu$^{+1}$hfac(s)+2TMVS(g)   step (2)

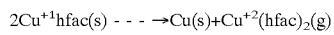

2Cu$^{+1}$hfac(s) - - - →Cu(s)+Cu$^{+2}$(hfac)$_2$(g)   step (3)

In step 1, the complex is adsorbed from the gas phase onto a metallic surface. In step 2, the coordinated olefin (TMVS in this specific case) dissociates from the complex as a free gas leaving behind Cu$^{+1}$hfac as an unstable compound. In step 3, the Cu$^{+1}$hfac disproportionates to yield copper metal and volatile Cu$^{+2}$(hfac)$_2$. The disproportionation at CVD temperatures appears to be most strongly catalyzed by metallic or electrically conducting surfaces. In an alternative reaction, the organometallic copper complex can be reduced by hydrogen to yield metallic copper.

The volatile liquid complex, Cu$^{+1}$hfac,TMVS, can be used to deposit Cu through either a thermal or plasma based process, with the thermal based process being most preferred. The substrate temperature for the plasma enhanced process is preferably between about 100 and about 400° C., while that for the thermal process is between about 50° C. and about 300° C., most preferably about 170° C. Following either of these processes, a Cu layer may be provided over a nucleation layer.

Additionally, the Cu layer may be deposited using electroplating or electroless plating techniques. In these applications, a CVD Cu seed layer may first be deposited on the Si layer prior to the electroplating or electroless deposition. It is also believed that the Si layer may be sufficient to seed a Cu layer deposited using electroplating techniques. The Ecectra® ECP system, available from Applied Materials, Inc., Santa Clara, Calif., is one such electroplating apparatus which could be used to advantage with the invention. A detailed description of the electrochemical deposition system and electroplating chemistry are provided in commonly assigned and copending U.S. patent application Ser. No. 09/289,074, entitled "Electro-chemical Deposition System," filed on Apr. 8, 1999, and Ser. No. 09/245,780, entitled "Electrodeposition Chemistry for Improved Filling of Apertures," filed on Feb. 5, 1999, respectively, which are hereby incorporated by reference in their entireties. Additionally, a detailed description of electroless plating is provided in commonly assigned and copending U.S. patent application No. 09/350,877, entitled "In-Situ Electroless Copper Seed Layer Enhancement In An Electroplating System," filed on Jul. 9, 1999, and Ser. No. 09/476,438, entitled "Apparatus And Method For Depositing An Electroless Solution," filed on Dec. 30, 1999, which are hereby incorporated by reference in their entireties.

EXAMPLE 1

Figure 2A:
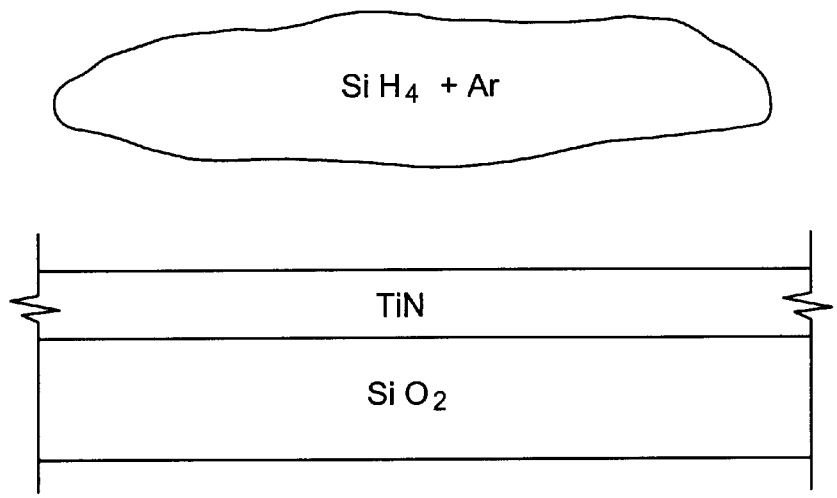
FIGS. 2A–2C are diagrams showing various stages in one method of improving the nucleation of copper onto a substrate.
Figure 2B:
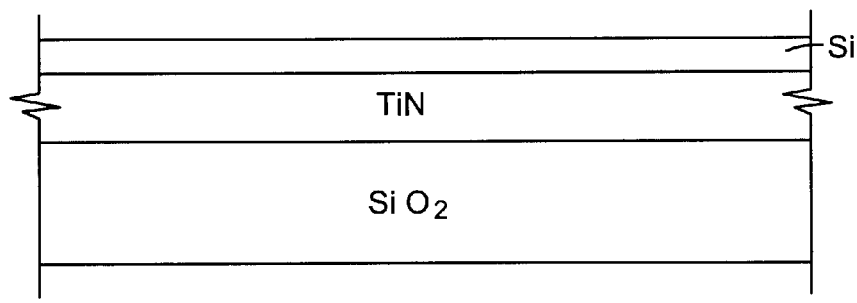
Figure 2C:
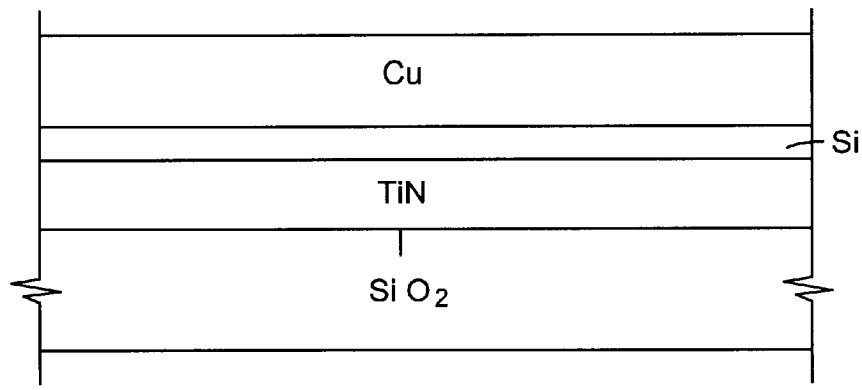
Figure 3A:
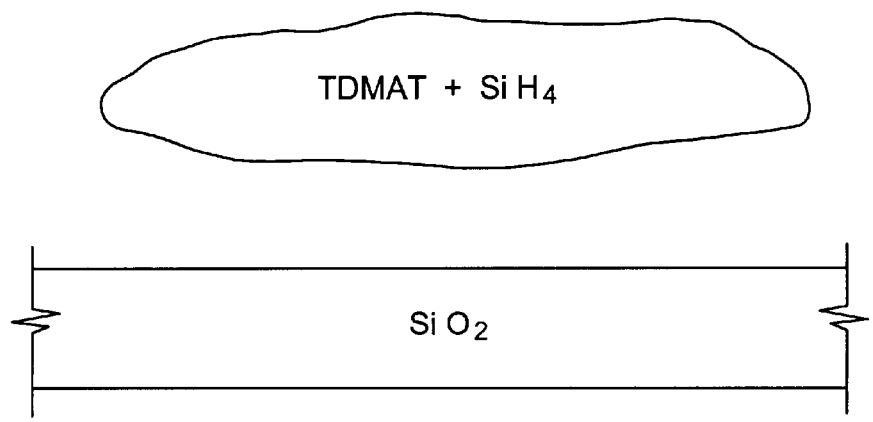
FIGS. 3A–3C are diagrams showing a second method of improving the nucleation of copper onto a substrate.
Figure 3B:
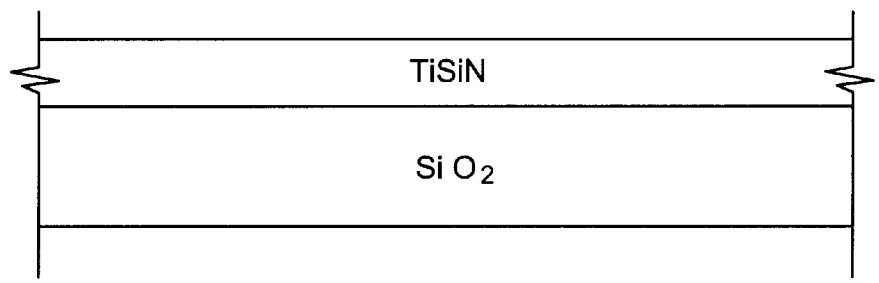
Figure 3C:
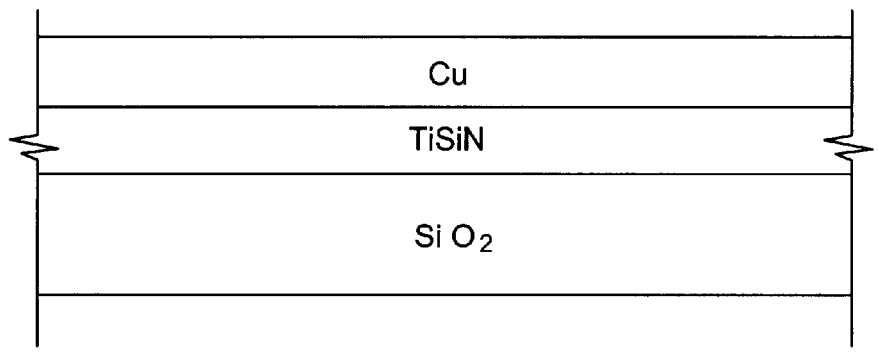

In one aspect of the invention, in order to alleviate the adhesion problems associated with placing a CVD layer of Cu over a TiN barrier layer, a thin amorphous silicon layer (Si in FIG. 2) is deposited on the TiN layer in the processing chamber before the deposition of the Cu layer. FIG. 2 is a diagram depicting the various stages of this method and showing a layer of Si disposed between a layer of Cu copper and a layer of TiN. In the preferred embodiment, a plasma is struck in an argon/silicon gas mixture introduced into the chamber. This plasma is shown in FIG. 2 as a (SiH$_4$+Ar) cloud over the substrate. The silicon in the SiH$_4$ is deposited on the substrate under the set of preferred temperature, pressure, and spacing parameters given below:

| | |
|---|---|
| Temperature (° C.) | 325–525 |
| Pressure (Torr) | 3–10 |
| Spacing (Mils) | 300–500 |
| Time (sec) | 10–150 |
| RF power (watts) | 100–300 |
| Ar (sccm) | 100–400 |
| SiH$_4$ (sccm) | 25–75 |

While the preferred value of these parameters is given above, it will be understood by those skilled in the art, that a range of parameters may also be used successfully within the spirit and scope of the invention. For example, the temperature can be in the range of 200° C. to 550° C., the pressure in the range of 100 mTorr to 15 Torr, the spacing of the gas plate from the substrate in the range of 300 mils to 900 mils, the RF power in the range of 50 W to 5000 W, the Ar flow in the range of 50 sccm to 1000 sccm and the SiH$_4$ flow rate in the range of 5 sccm to 500 sccm. Additionally, other silicon source gases can be used. The time of the process can range from about 10 seconds to about 5 minutes depending on the desired process.

Once the thin Si layer is deposited in the CVD processing chamber, the Cu gas is introduced into the chamber and the chamber parameters changed to those normally used in Cu deposition using Cu containing gas. A Cu layer is then deposited over the Si layer as shown in FIG. 2. Reactive copper nucleates easily on a surface of Si and it is believed that the silicon surface provides an improved adhesion surface over the TiN for the subsequent reactive, Cu layer.

EXAMPLE 2

In another aspect of the invention, a silicon gas is introduced simultaneously with the TDMAT gas in the TiN deposition process to form a barrier layer including silicon. Specifically, silane gas is introduced simultaneously with the precursor gas of tetrakis-dimethylamido-titanium, Ti(N (CH$_4$)$_2$)$_4$. In the typical deposition step of a TDMAT TiN process TxZ chamber, the following parameters are used to form a layer of TiN 100 Å to 110Å thick of untreated TiN upon the substrate in a deposition step that may be repeated numerous times.

| | |
|---|---|
| Time (s) | 5–25 |
| Pressure (Torr) | 1–5 |
| Temp (° C.) | 350–550 |
| TDMAT/He (sccm) | 125–325 |
| He (sccm) | 175–375 |
| N$_2$ (sccm) | 200–400 |

EXAMPLE 3

According to the invention, the characteristics of the recipe above would remain the same. However, SiH$_4$ will also be introduced into the chamber simultaneously with the TDMAT gas:

| Time (s) | 5–25 |
|---|---|
| Pressure (Torr) | 1–5 |
| Temp(° C.) | 350–550 |
| TDMAT/He (sccm) | 125–325 |
| He (sccm) | 175–375 |
| $N_2$ (sccm) | 200–400 |
| $SiH_4$ (sccm) | 25–75 |

The resulting layer is a TiSiN layer offering better nucleating characteristics for a subsequent deposition of copper. Specifically, the barrier layer formed of TiSiN will offer nucleation cites containing silicon, a better adhesion surface that allows nucleation and growth of subsequently deposited copper.

In the above examples, a Cu layer may be deposited on a CVD Cu seed layer formed on the Si layer using electroplating or electroless plating techniques. In example 1, the CVD Cu layer may be deposited as a thin seed layer on which electroplating deposition may proceed. Additionally, while the invention may be used to advantage by depositing the Si and Cu layers in the same chamber, it should be understood that the Si and Cu layers may be deposited in separate chambers. However, it is advantageous to deposit the layers sequentially without exposing the substrate to atmosphere between the Si and Cu deposition steps to prevent oxidation.

While foregoing is directed to the preferred embodiment of the present invention, other and further embodiments of the invention may be devised without departing from the basic scope thereof, and the scope thereof is determined by the claims that follow.

What is claimed is:

1. A method for depositing copper on a substrate, comprising:
    positioning a substrate having a metal nitride layer deposited thereon in at least a first processing chambers;
    depositing a thin, amorphous silicon (Si) layer, from a first introduced processing gas mixture of a silicon source and an inert gas, onto the substrate for a first predetermined time; and
    depositing a copper (Cu) layer onto the thin Si layer from a second introduced processing gas mixture containing a Cu source for a second pre-determined time.

2. The method of claim 1, wherein the amorphous silicon layer is deposited over a layer of titanium nitride (TiN) deposited on the substrate.

3. The method of claim 1, wherein the silicon source is silane ($SiH_4$) and the inert gas is argon (Ar).

4. The method of claim 1, wherein the copper source is copper$^{+1}$hfac,TMVS.

5. The method of claim 1, wherein the Si layer is deposited at a temperature in the range of about 350° C. to about 550° C.

6. The method of claim 1, wherein the Si layer is deposited at a pressure in the range of about 100 mTorr to about 15 Torr.

7. The method of claim 1, wherein the first processing gas mixture comprises Argon and Silane (Ar+$SiH_4$) in the ratio range of about 10:1 to about 5:1.

8. The method of claim 1, wherein the first processing gas mixture comprises Argon and Silane (Ar+$SiH_4$) in the ratio of about 6:1.

9. The method of claim 1, wherein the first predetermined time is in the range of about 10 seconds to about 5 minutes.

10. The method of claim 1, wherein the first predetermined time is in the range of about 1 minute to about 2 minutes.

11. The method of claim 1, wherein the Si layer is deposited at a temperature in the range of about 200° C. to about 550° C.

12. The method of claim 1, wherein the copper layer is deposited by CVD.

13. The method of claim 1, wherein the copper layer is deposited by a plasma enhanced process.

14. The method of claim 1, further comprising a second copper layer deposited by electroplating.

15. A method for depositing copper on a substrate, comprising:
    positioning a substrate having a metal nitride layer deposited thereon in a processing chamber;
    depositing a thin, amorphous silicon (Si) layer, from a first introduced processing gas mixture of a silicon source and an inert gas, onto the substrate for a first predetermined time;
    depositing a copper (Cu) seed layer onto the thin Si layer from a second introduced processing gas mixture containing a Cu source for a second pre-determined time;
    positioning the substrate in another processing chamber; and
    disposing the substrate and an anode in a suppressed plating solution, the solution containing copper ions, and electrodepositing a second copper layer onto the substrate from the copper ions in the solution.

16. The method of claim 15, wherein the silicon layer and the copper seed layer are deposited in a first and a second processing chamber.

* * * * *